US012672497B2

(12) United States Patent
Huang et al.

(10) Patent No.: US 12,672,497 B2
(45) Date of Patent: Jun. 30, 2026

(54) WAFER WITH TEST STRUCTURE AND METHOD OF DICING WAFER

(71) Applicant: UNITED MICROELECTRONICS CORP., Hsin-Chu City (TW)

(72) Inventors: Wei-Ren Huang, Changhua County (TW); Chen-Hsiao Wang, Hsinchu City (TW); Kai-Kuang Ho, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 715 days.

(21) Appl. No.: 17/386,554

(22) Filed: Jul. 28, 2021

(65) Prior Publication Data
US 2023/0018710 A1     Jan. 19, 2023

(30) Foreign Application Priority Data
Jul. 8, 2021     (CN) .......................... 202110771372.4

(51) Int. Cl.
*H10P 54/00*          (2026.01)
*H10P 50/00*          (2026.01)
*H10P 50/24*          (2026.01)
*H10P 74/00*          (2026.01)

(52) U.S. Cl.
CPC ............ *H10P 54/00* (2026.01); *H10P 50/242* (2026.01); *H10P 50/691* (2026.01); *H10P 50/73* (2026.01); *H10P 74/273* (2026.01)

(58) Field of Classification Search
None
See application file for complete search history.

(56) References Cited

U.S. PATENT DOCUMENTS

| | | | |
|---|---|---|---|
| 7,494,900 B2 | 2/2009 | Harris | |
| 8,975,162 B2 | 3/2015 | Lei | |
| 10,515,853 B1* | 12/2019 | Chen | ................... H01L 21/3065 |
| 10,685,883 B1* | 6/2020 | Wei | ........................ H01L 23/544 |
| 2002/0024115 A1* | 2/2002 | Ibnabdeljalil | ......... H01L 23/562 |
| | | | 257/E23.194 |
| 2003/0122220 A1* | 7/2003 | West | ..................... H01L 23/585 |
| | | | 257/E23.194 |

(Continued)

FOREIGN PATENT DOCUMENTS

| | | |
|---|---|---|
| CN | 107591361 A | 1/2018 |
| JP | 2016-58578 A | 4/2016 |

(Continued)

*Primary Examiner* — Erik T. K. Peterson
(74) *Attorney, Agent, or Firm* — Winston Hsu

(57) ABSTRACT

A wafer with a test structure includes a wafer with a front side and a back side. A first die, a second die, a third die and a scribe line are disposed on the wafer. The scribe line is positioned between the dice. The first die includes a first dielectric layer and a first metal connection disposed within and on the first dielectric layer. A test structure and a dielectric layer are disposed on the scribe line, wherein the test structure is on the dielectric layer. Two first trenches are respectively disposed between the first dielectric layer and the dielectric layer and disposed at one side of the dielectric layer. Two second trenches penetrate the wafer, and each of the two second trenches respectively connects to a corresponding one of the two first trenches. A grinding tape covers the front side of the wafer and contacts the test structure.

11 Claims, 6 Drawing Sheets

(56)  References Cited

U.S. PATENT DOCUMENTS

| | | | |
|---|---|---|---|
| 2004/0084777 A1 | 5/2004 | Yamanoue | |
| 2004/0150070 A1 | 8/2004 | Okada | |
| 2004/0169258 A1* | 9/2004 | Lijima | H01L 22/32 |
| | | | 257/E21.264 |
| 2004/0212047 A1* | 10/2004 | Joshi | H01L 23/585 |
| | | | 257/620 |
| 2006/0166466 A1 | 7/2006 | Maki | |
| 2007/0264832 A1 | 11/2007 | Arita | |
| 2007/0290204 A1* | 12/2007 | Jao | H01L 22/34 |
| | | | 257/48 |
| 2008/0128694 A1 | 6/2008 | Arita | |
| 2008/0220591 A1 | 9/2008 | Nakamura | |
| 2009/0321890 A1* | 12/2009 | Jeng | H01L 23/562 |
| | | | 257/E23.193 |
| 2010/0112782 A1* | 5/2010 | Teixeira | H01L 21/78 |
| | | | 438/459 |
| 2011/0241164 A1* | 10/2011 | Nakamura | H01L 23/585 |
| | | | 257/774 |
| 2012/0003817 A1 | 1/2012 | Lin | |
| 2013/0302969 A1 | 11/2013 | Priewasser | |
| 2014/0167209 A1* | 6/2014 | Meiser | H01L 23/562 |
| | | | 438/424 |
| 2015/0270228 A1 | 9/2015 | Tang | |
| 2015/0279930 A1* | 10/2015 | Breymesser | H10D 30/0297 |
| | | | 438/424 |
| 2016/0204071 A1* | 7/2016 | Liu | H01L 21/78 |
| | | | 257/620 |
| 2017/0372962 A1 | 12/2017 | Seddon | |
| 2018/0076088 A1* | 3/2018 | Sandoh | H01L 21/304 |
| 2018/0226471 A1* | 8/2018 | Hille | H01L 21/30608 |
| 2020/0091100 A1 | 3/2020 | Han | |
| 2020/0144095 A1 | 5/2020 | Mikami | |
| 2020/0312715 A1* | 10/2020 | Choi | H01L 21/76838 |
| 2021/0125925 A1* | 4/2021 | Heo | H01L 23/5283 |
| 2021/0134685 A1* | 5/2021 | Chen | H01L 24/05 |
| 2022/0005733 A1* | 1/2022 | Jeong | H01L 23/10 |

FOREIGN PATENT DOCUMENTS

| | | |
|---|---|---|
| JP | 2016-201412 A | 12/2016 |
| JP | 2018-60871 A | 4/2018 |
| KR | 2002-0068608 A | 8/2002 |
| KR | 10-0863333 B1 | 10/2008 |

* cited by examiner

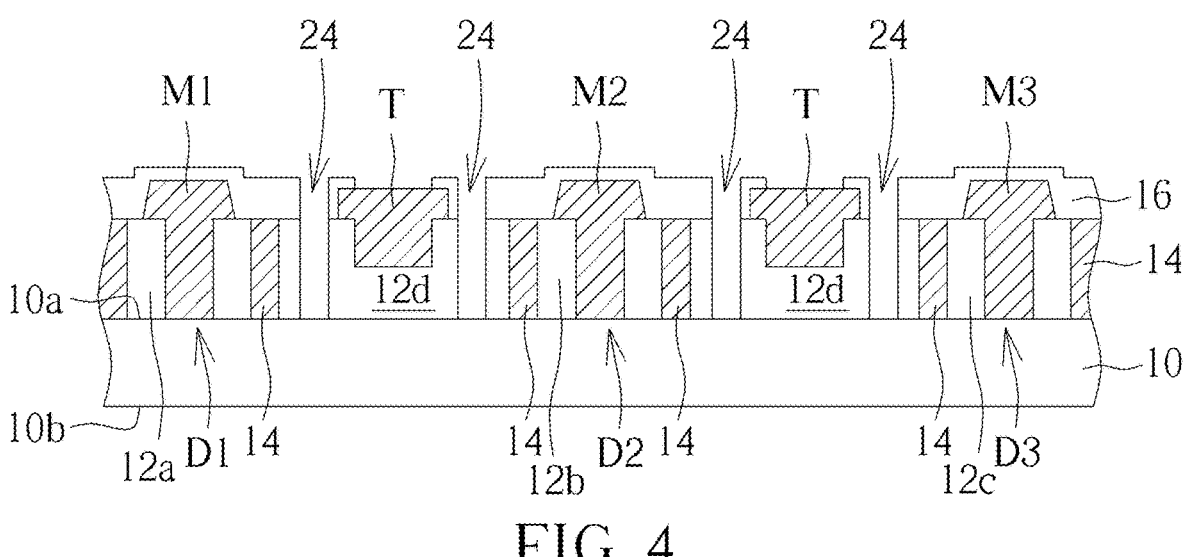
FIG. 4
FIG. 5

1

WAFER WITH TEST STRUCTURE AND METHOD OF DICING WAFER

BACKGROUND OF THE INVENTION

1. Field of the Invention

The present invention relates to a wafer with a test structure and a method of dicing a wafer, and more particularly to a method of dicing a wafer from a back side by a plasma process while a test structure remains on a front side of the wafer.

2. Description of the Prior Art

In the fields of optoelectronics, semiconductors, and electronics, silicon wafers are often used as materials for electronic elements. However, the hardness and brittleness of silicon wafers cause difficulties in wafer dicing. Traditionally, methods of wafer cutting can be classified into two ways: contact and non-contact. The contact way is to directly cut the surface of the silicon wafer through a diamond saw or a diamond wheel saw. The non-contact way is mainly to use a high-energy laser with short wavelength to focus the laser on the surface of the silicon wafer in a short time to break bonds of the material layer to cut.

In addition, multiple dielectric layers, conductive layers, and metal layers are disposed on the silicon wafer. Different material layers are patterned by using lithography process to form circuit elements on the silicon wafer. After completing the aforementioned circuit elements, wafer-level testing is used to determine the yield of the process. During testing, the test keys on the wafer are detected to find out dice with defects.

However, due to the existence of test keys, both of the silicon wafer and test keys need to be cut when cutting the wafer with a saw, or the test keys need to be preheated and removed before cutting the silicon wafer with a laser. These processes will cause cracks on the silicon wafer.

In view of this, it is necessary to provide a dicing method with high yield and high productivity to improve the aforementioned shortcomings.

SUMMARY OF THE INVENTION

According to a preferred embodiment of the present invention, a wafer with a test structure includes a wafer with a front side and a back side, wherein a first die, a second die, and a scribe line are disposed on the front side of the wafer, the scribe line is positioned between the first die and the second die, the first die includes a first dielectric layer and a first metal connection disposed within and on the first dielectric layer. A test structure and a dielectric layer are disposed on the scribe line, wherein the test structure is disposed on the dielectric layer. Two first trenches, wherein one of the two first trenches is disposed between the first dielectric layer and the dielectric layer and the other one of the two first trenches is disposed at one side of the dielectric layer. Two second trenches penetrate the wafer, and each of the two second trenches respectively connects to a corresponding one of the two first trenches. A grinding tape covers the front side of the wafer and contacts the test structure.

According to another preferred embodiment of the present invention, a method of dicing a wafer includes providing a wafer with a front side and a back side, wherein a first die, a second die and a scribe line are disposed on the front side of the wafer, the scribe line is positioned between the first die and the second die, a test structure and a dielectric layer are disposed on the scribe line, wherein the test structure is disposed on the dielectric layer, the first die includes a first dielectric layer and a first metal connection which is disposed within and on the first dielectric layer, two first trenches are respectively disposed within the dielectric layer at two sides of the test structure and the wafer is exposed through the two first trenches. Next, a grinding tape is provided to cover the front side of the wafer and contact the test structure. After that, the back side of the wafer is planarized to thin the wafer. After thinning the wafer, a plasma process is performed, wherein the plasma process includes etching the back side of the wafer to form two second trenches respectively penetrating the wafer, wherein each of the two second trenches respectively connects to a corresponding one of the two first trenches.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a fabricating method of dicing a wafer according to a preferred embodiment of the present invention, wherein:

FIG. 2 depicts a sectional view taken along line AA' in FIG. 1;

FIG. 3 depicts a fabricating stage following FIG. 2;

FIG. 4 depicts a fabricating stage following FIG. 3;

FIG. 5 depicts a fabricating stage following FIG. 4;

FIG. 6 depicts a fabricating stage following FIG. 5;

FIG. 7 depicts a fabricating stage following FIG. 6;

FIG. 8 depicts a fabricating stage following FIG. 7;

FIG. 9 depicts a fabricating stage following FIG. 8; and

DETAILED DESCRIPTION

Figure 1:
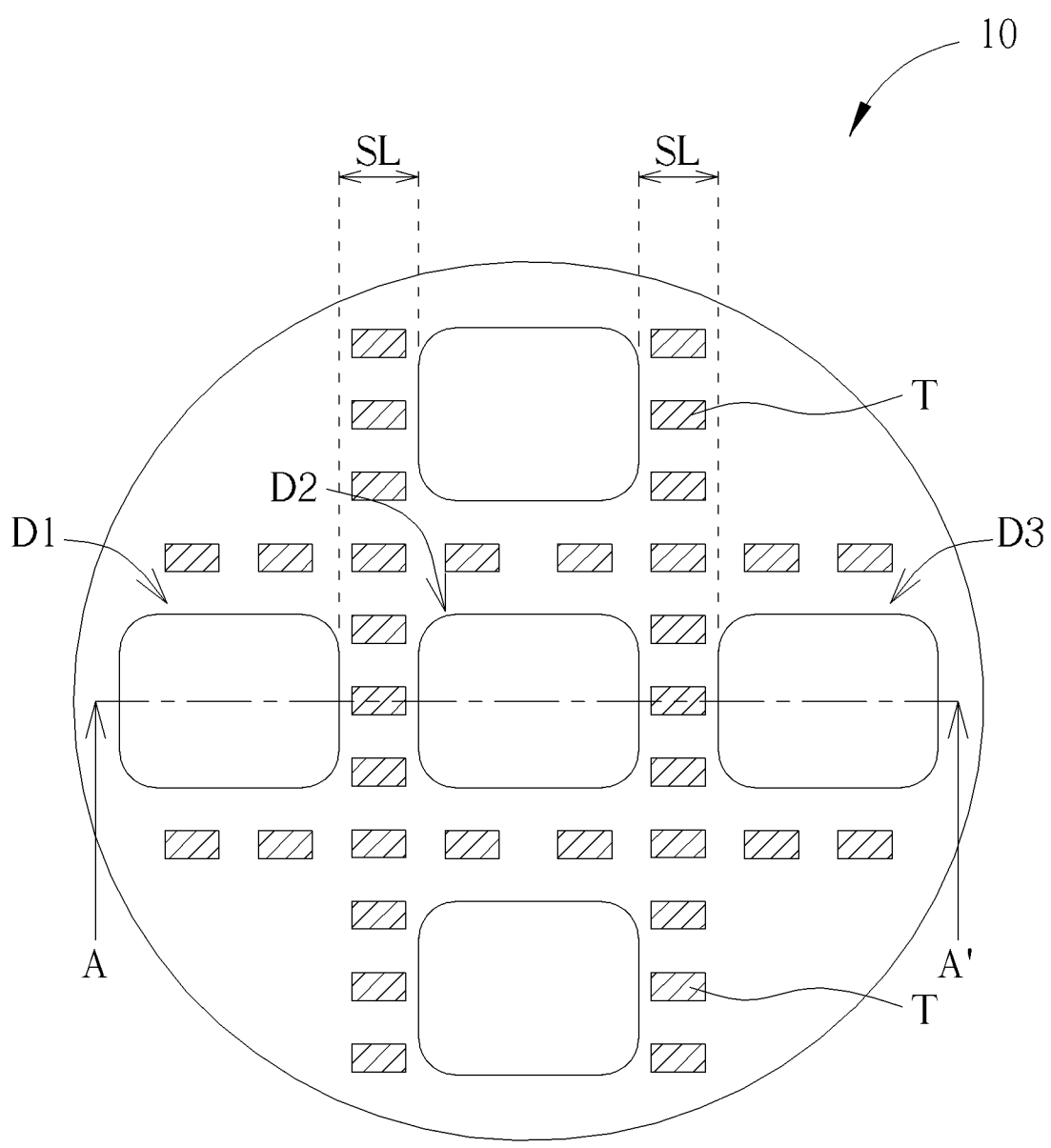
Figure 2:
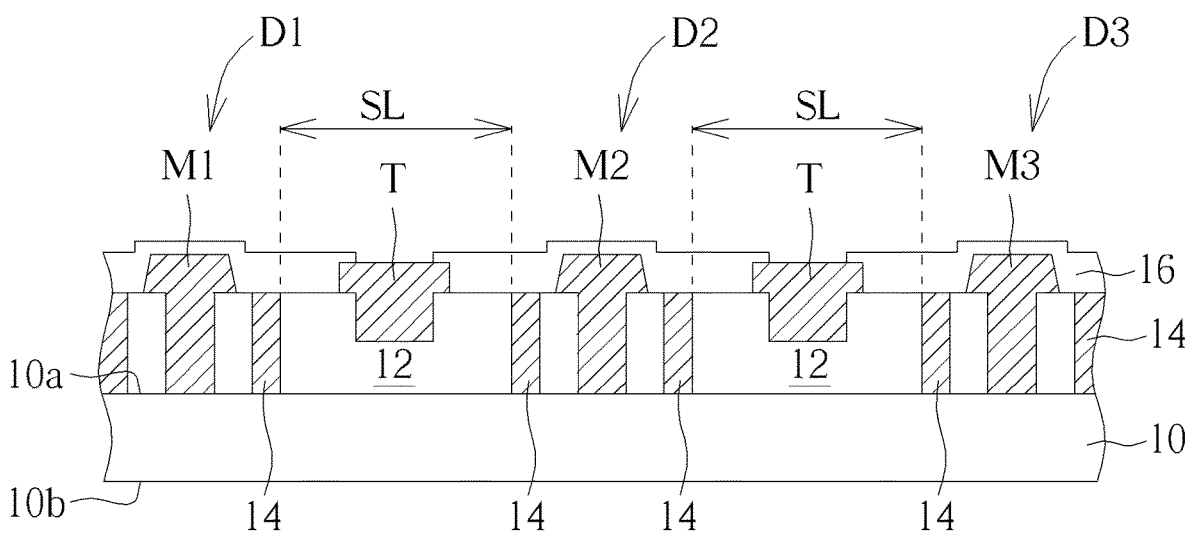
Figure 3:
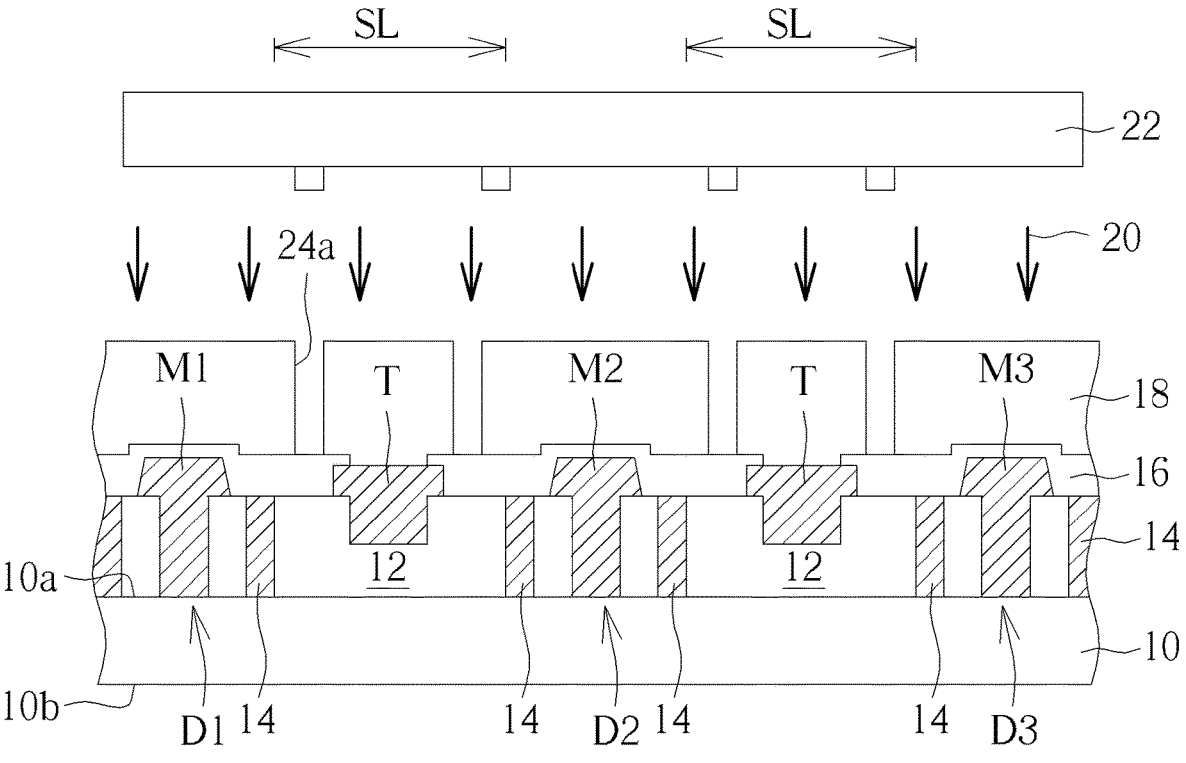

FIG. 1 to FIG. 9 depict a fabricating method of dicing a wafer according to a preferred embodiment of the present invention, wherein FIG. 2 depicts a sectional view taken along line AA' in FIG. 1, and FIG. 3 depicts a fabricating stage following FIG. 2.

As shown in FIG. 1 and FIG. 2, a wafer 10 is provided. The wafer 10 is preferably a silicon wafer. The wafer 10 includes a front side 10a and a back side 10b. Numerous dice are disposed on the wafer 10. Numerous scribe lines are respectively disposed between each of dice to serve as a dicing path for wafer 10. For example, a first die D1, a second die D2, a third die D3 and two scribe lines SL are disposed on the front side 10a of the wafer 10. The scribe lines SL are respectively disposed between the first die D1 and the second die D2, and between the second die D2 and the third die D3. Numerous test structures T are disposed on each of the scribe lines SL. The first die D1, the second die D2 and the third die D3 respectively include an active element (not shown) such as a transistor on the wafer 10. A dielectric material 12 is disposed on the active element and covers the wafer 10. The first die D1 further includes a first metal connection M1 disposed on and within the dielectric material 12. The second die D2 further includes a second metal connection M2 disposed on and within the dielectric material 12. The third die D3 further includes a third metal connection M3 disposed on and within the dielectric material 12. The first metal connection M1, the second metal connection M2 and the third metal connection M3 preferably respectively include front end of lines, back end of lines and a protective ring 14. The test structures T are partly embedded within the dielectric material 12, and partly disposed on the dielectric material 12. A topmost surface of each of the test structures T, a topmost surface of the first metal connection M1, a topmost surface of the second metal connection M2 and a topmost surface of the third metal connection M3 are aligned. That is, the last layer of each of the test structures T, the last layer of the first metal connection M1, the last layer of the second metal connection M2, and the last layer of the third metal connection M3 are made of the same metal layer during the fabricating process. A protective layer 16 covers the first metal connection M1, the second metal connection M2 and the third metal connection M3. The test structures T are exposed through the protective layer 16.

As shown in FIG. 3 and FIG. 4, a first photoresist 18 is formed to cover the protective layer 16 and the test structures T. Then, a first lithographic process 20 is performed. The first lithographic process 20 includes a step of patterning the first photoresist 18 by a photo mask 22 which includes patterns corresponding to the first trenches 24. Therefore, the patterned first photoresist 18 has recesses 24a corresponding to the first trenches 24 thereon. Later, numerous first trenches 24 are formed by using the patterned first photoresist 18 as a mask to etch the dielectric material 12 and the protective layer 16.

The first trenches 24 divide the dielectric material 12 into a first dielectric layer 12a, a second dielectric layer 12b, a third dielectric layer 12c, and a dielectric layer 12d. The first metal connection M1 is within and on the first dielectric layer 12a. The second metal connection M2 is within and on the second dielectric layer 12b. The third metal connection M3 is within and on the third dielectric layer 12c. The test structures T are within and on the dielectric layer 12d. Numerous first trenches 24 are respectively disposed between the first dielectric layer 12a and the dielectric layer 12d, between the second dielectric layer 12b and the dielectric layer 12d, and between the third dielectric layer 12c and the dielectric layer 12d. The wafer 10 is exposed through each of the first trenches 24. After the etching process, the first photoresist 18 is removed.

As shown in FIG. 5, a grinding tape 26 is provided to cover the front side 10a of the wafer 10 and contact the test structures T and the protective layer 16. Later, the wafer 10 is turned over to make the back side 10b of the wafer 10 to face up. After that, the back side 10b is grinded to thin the wafer 10. Next, a second photoresist 28 is formed to cover the back side 10b of the wafer 10. Subsequently, a second lithographic process 30 is performed. The second lithographic process 30 includes a step of patterning the second photoresist 28 by the photo mask 22 to form numerous openings 28a within the second photoresist 28. However, based on different product designs, the photo mask utilized in the second lithographic process 30 can be different from the photo mask 22 utilized in the first lithographic process 20.

Figure 6:
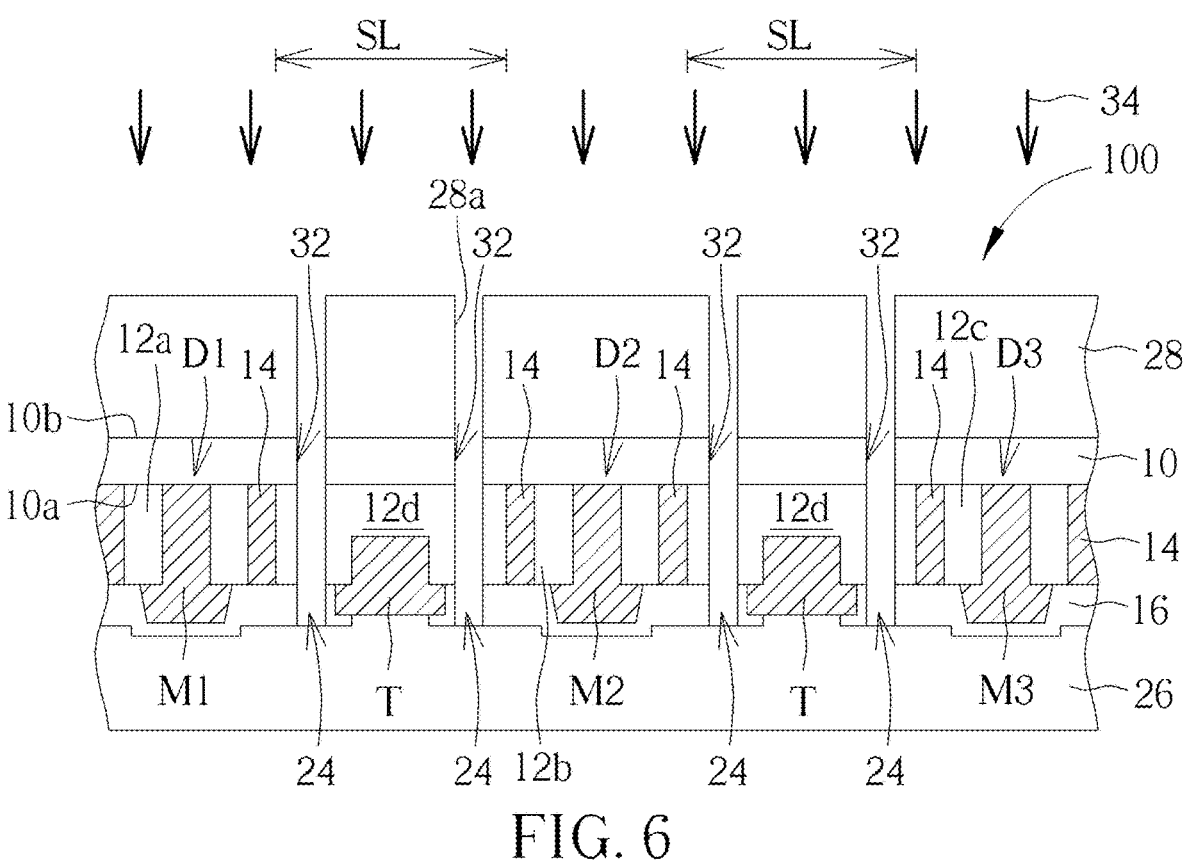

As shown in FIG. 6, a plasma process 34 is performed. The plasma process 34 includes a step of etching from the back side 10b toward the front side 10a of the wafer 10 by taking the second photoresist 28 as a mask to form numerous second trenches 32 which respectively penetrate the wafer 10. The sidewalls of each second trench 32 are substantially aligned with the sidewalls of a corresponding one of the openings 28a within the second photoresist 28. Because the first trenches 24 and the second trenches 32 are defined by the same photo mask 22, positions of the first trenches 24 and positions of the second trenches 32 overlap each other. Therefore, each of the second trenches 32 respectively connects to a corresponding one of the first trenches 24. It is noteworthy that during the plasma process 34, the test structures T are not removed. In details, because the first trenches 24 are disposed at two sides of one of the test structures T, and the second trenches 32 are disposed at the back side 10b of the wafer 10, the test structures T are not etched during the plasma process 34. Therefore, the test structures T do not need to be removed before the plasma process 34.

Etchant gas used in the plasma process 34 includes $SF_6$, $CF_4/O_2$, $CF_2Cl_2$、$CF_3Cl$, $SF_6/O_2/Cl_2$, $Cl_2/H_2/C_2F_6/CCl_4$, $C_2ClF_5/O_2$, Si $F_4/O_2$, $NF_3$, $ClF_3$, $CCl_4$, $CCl_3F_5$, $C_2ClF_5/SF_6$, $C_2F_6/CF_3Cl$, $Br_2$ or $CF_3Cl/Br_2$. The etchant gas used in this embodiment selectively etches silicon; therefore other materials will not be damaged. According to a preferred embodiment of the present invention, the etchant gas used in the plasma process 34 is $SF_6$. The operational time of the plasma process 34 is between 1 to 20 minutes, and the operational time can be adjusted based on the thickness of the wafer 10.

Traditionally, when a die saw is used to cut wafers, the scribe lines need to be cut sequentially. On the other hand, laser scribing can result in cracks on the wafer due to thermal heating of the laser. By using the plasma process 34 of the present invention to etch the wafer 10, numerous second trenches 34 can be formed at the same time. Therefore, the dice on the wafer 10 can be separated at the same time, and cracks will not occur on the wafer 10. In addition, a width of each of the scribe lines SL used in plasma process 34 is smaller comparing to other dicing process, therefore, for wafers with the same size, more dice can be arranged on the wafer diced by the plasma process 34 than the wafer diced by a die saw or laser scribing. As a result, productivity of a die per unit time can be increased. Moreover, there are two scribe cuts on single scribe line SL along the same direction. Each of the two scribe cuts is formed by one first trench 24 connecting to one second trench 32. The two scribe cuts on single scribe line SL avoid from cutting the test structure T because they are at two side of the test structure T. On the other hand, along the same direction, there is only one scribe cut on single scribe line SL by using a die saw or laser scribing to dice the wafer.

Figure 7:
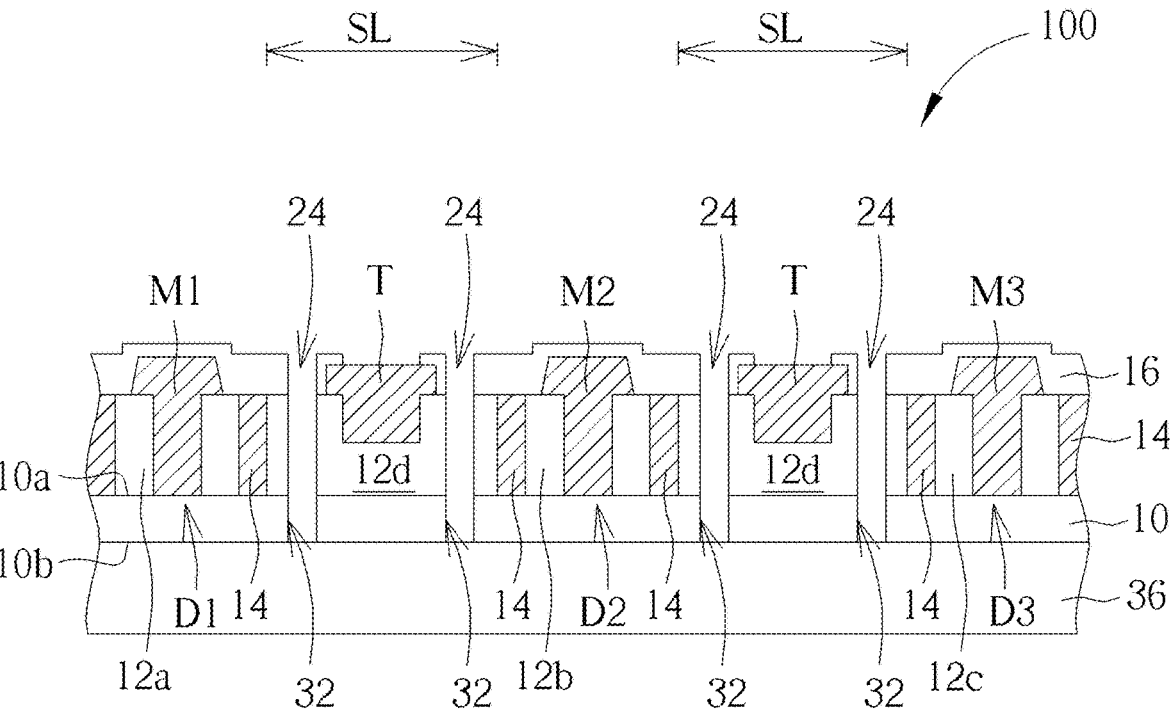
Figures 8, 9:
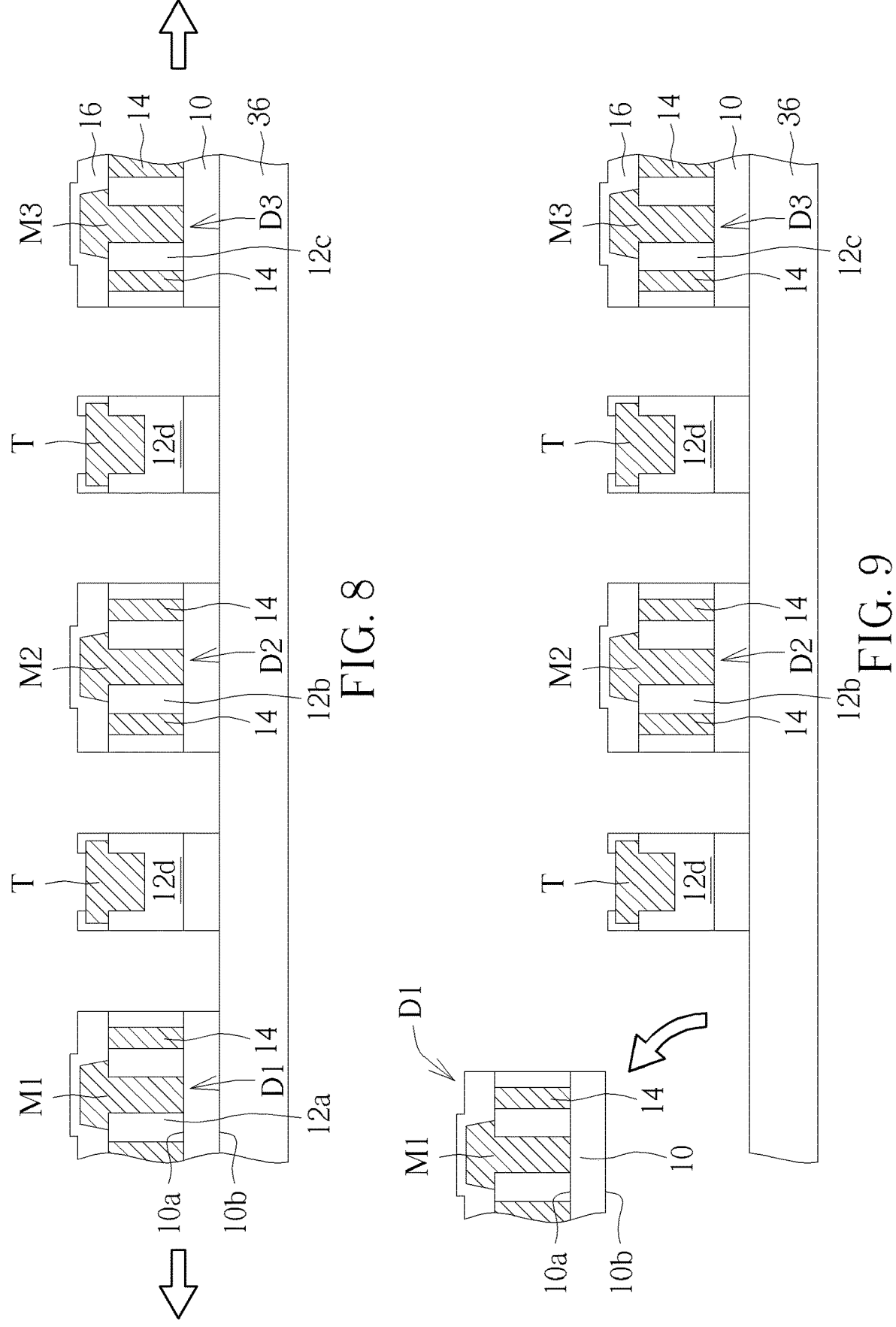

As shown in FIG. 7, the second photoresist 28 is removed after the plasma process 34. Then, a tape 36 is provided to attach to the back side 10b of the wafer 10. The grinding tape 26 is removed after the tape 36 attaches to the back side 10b of the wafer 10. Next, as shown in FIG. 8, the tape 36 is extended to increase the distance between the first die D1, the second die D2 and the third die D3. In other words, the width of each of the first trenches 24 and the width of each of the second trenches 32 are increased. Finally, as shown in FIG. 9, the first die D1, the second die D2 and the third die D3 are removed from the tape 36. Now, the method of dicing a wafer of the present invention is completed.

Although the preferred embodiment illustrated as above is demonstrated by dicing three dice, however, the method of the present invention can be applied to dice all the dice on the entire wafer.

As shown in FIG. 6, according to another preferred embodiment of the present invention, a wafer with a test structure 100 includes a wafer 10 with a front side 10a and a back side 10b. The wafer 10 is preferably a silicon wafer. A first die D1, a second die D2 and a scribe line SL are disposed on the front side 10*a* of the wafer 10. The scribe line SL is positioned between the first die D1 and the second die D2. The first die D1 includes a first dielectric layer 12*a* and a first metal connection M1. The first metal connection M1 is disposed within and on the first dielectric layer 12*a*. The second die D2 includes a second dielectric layer 12*b* and a second metal connection M2. The second metal connection M2 is disposed within and on the second dielectric layer 12*b*. A test structure T and a dielectric layer 12*d* are disposed on the scribe line SL. Part of the test structure T is disposed on the dielectric layer 12*d* and part of the test structure T is disposed within the dielectric layer 12*d*. The test structure T is disposed between the first metal connection M1 and the second metal connection M2. Two first trenches 24 are respectively disposed between the dielectric layer 12*d* and the first dielectric layer 12*a*, and disposed at one side of the dielectric layer 12*d*. In details, one of the first trenches 24 is disposed between the first dielectric layer 12*a* and the dielectric layer 12*d* and the other one of the first trenches 24 is disposed between the dielectric layer 12*d* and the second dielectric layer 12*b*. Two second trenches 32 penetrate the wafer 10, and each of the second trenches 32 respectively connects to a corresponding one of the first trenches 24. Therefore, the first die D1, the second die D2, and the test structure T are separated from each other because of the first trenches 24 connecting to the second trench 32. A grinding tape 26 covers the front side 10*a* of the wafer 10 and contacts the test structure T.

The sidewall of each of the second trenches 32 is substantially flat. There is no delamination or crack on the sidewall of each of the second trenches 32. The test structure T is not exposed from the first trenches 24. The first metal connection M1 and the second metal connection M2 are both not exposed from the first trenches 24. In other words, the sidewall of the first trench 24 is formed by the first dielectric layer 12*a*, the dielectric layer 12*d* and the second dielectric layer 12*b*. According to a preferred embodiment of the present invention, a depth of each of the first trench 24 is between 8 to 15 micrometers.

A protective layer 16 covers the first metal connection M1 and the second metal connection M2, and the test structure T is exposed from the protective layer 16. A topmost surface of the test structure T, a topmost surface of the first metal connection M1 and a topmost surface of the second metal connection M2 are aligned.

Although only two test structures T and three dice are demonstrated in FIG. 6, however, please refer to FIG. 1, there are actually numerous test structures T disposed on each of the scribe lines SL, and numerous dice are also arranged on the wafer 10. Each of the test structures T can be used to check the integrity of the die around the test structure T. All the test structures T are not electrically connected to the dice on the wafer 10.

Figure 10:
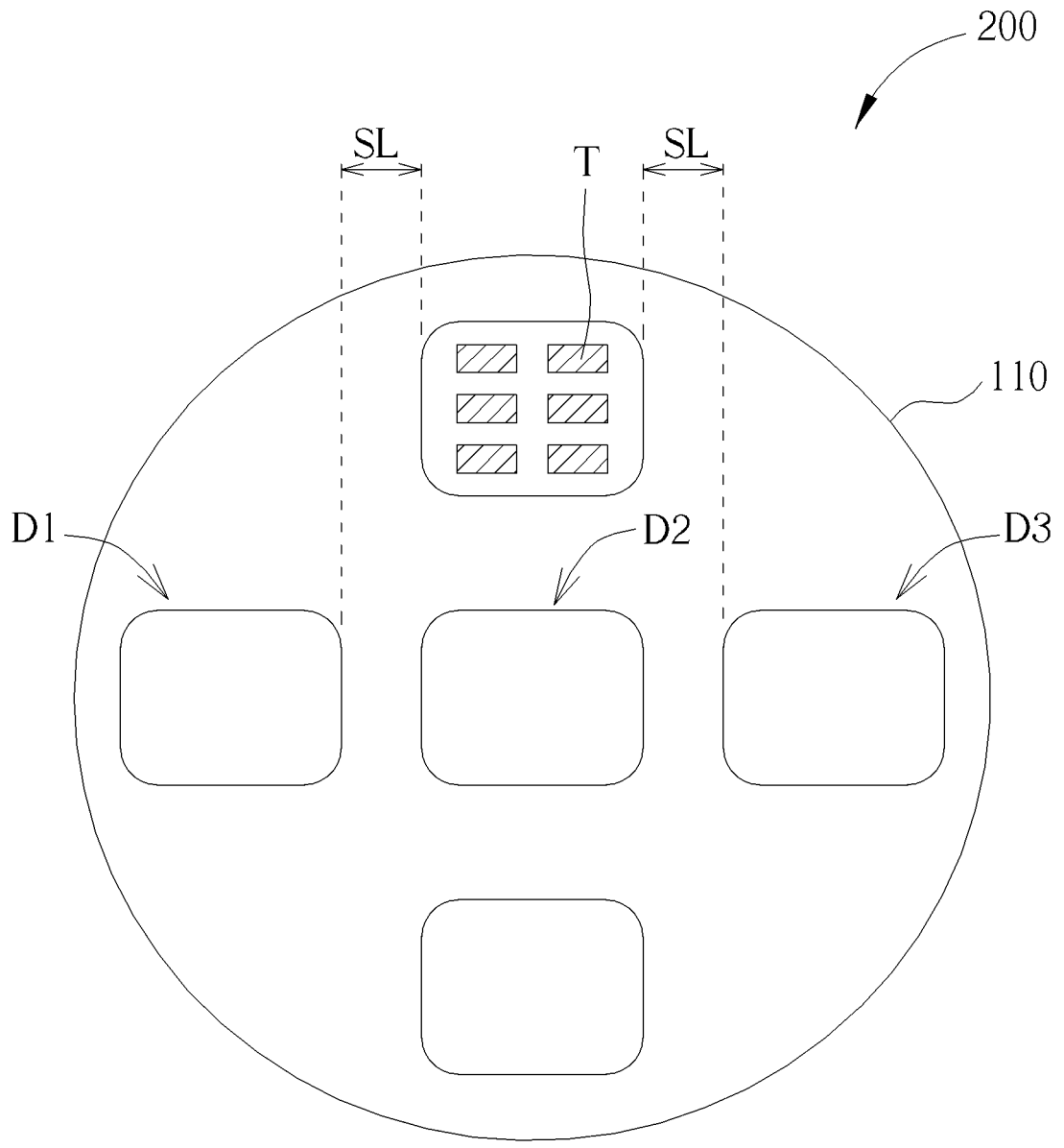
FIG. 10 depicts a wafer with test structures according to an example of the present invention.

FIG. 10 depicts a wafer 200 with test structures according to an example of the present invention, wherein elements which substantially the same as the elements in FIG. 1 are denoted by the same reference numerals; an accompanying explanation is therefore omitted.

Because the plasma process can't be used to a heterogeneous cutting, the test structures T in FIG. 10 have to be moved from the scribe line SL to a region originally designed for disposing a die. In this way, scribe lines SL of the wafer 10 can be cut from the front side 10*a* by a plasma process to separating the dice. However, the test structures T occupy the region for a die, and therefore productivity of single wafer 110 is decreased. Moreover, because the test structures T are not distributed on scribe lines SL, but are gathered within one region for a die, the test structures T can only check the integrity of dice around the region. In other words, the range that the test structures T can check become narrower. In this way, a process of checking dice can only be performed after finishing the entire circuit fabricating processes.

The present invention provides a plasma process to dice a wafer from the back side and cut from two sides of the test structure. By doing so, delamination or cracks will not occur at the sidewalls of the wafer. Furthermore, by using the method in the present invention, the test structure can remain on the scribe line, and do not need to be moved to a die region. Therefore, production of the wafer is maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer with a test structure, comprising:
   a wafer with a front side and a back side, wherein a first die, a second die, and a scribe line are disposed on the front side of the wafer, the scribe line is positioned between the first die and the second die, the first die comprises a first dielectric layer and a first metal connection which is disposed within and on the first dielectric layer;
   a test structure and a dielectric layer disposed on the scribe line, wherein the test structure is disposed on the dielectric layer;
   two first trenches, wherein one of the two first trenches is disposed between the first dielectric layer and the dielectric layer and at a first side of the test structure, and wherein the other one of the two first trenches is disposed at one side of the dielectric layer, at a second side of the test structure, the first side and the second side are opposite, and the first side and the second side are two sides of the same test structure;
   two second trenches penetrating the wafer, wherein one of the two second trenches connects to the first trench disposed at the first side of the test structure, and the other one of the two second trenches connects to the first trench disposed at the second side of the test structure, and wherein in a sectional view taken along a line passing through the first die, the test structure, the second die, and the scribe line, the two second trenches do not connect to each other;
   a photoresist covering and contacting the back side of the wafer, wherein openings within the photoresist correspond to the two second trenches, and sidewalls of each of the openings are aligned with sidewalls of a corresponding one of the two second trenches; and
   a grinding tape covering the front side of the wafer and contacting the test structure.

2. The wafer with a test structure of claim 1, wherein the second die comprises a second metal connection and a second dielectric layer, the second metal connection is disposed within and on the second dielectric layer, and one of the two first trenches is disposed between the second dielectric layer and the dielectric layer.

3. The wafer with a test structure of claim 2, wherein the test structure is disposed between the first metal connection and the second metal connection.

4. The wafer with a test structure of claim 1, wherein a topmost surface of the first metal connection is aligned with a topmost surface of the test structure.

5. The wafer with a test structure of claim 1, wherein the first metal connection comprises a protective ring.

6. The wafer with a test structure of claim 1, wherein a sidewall of each of the two second trenches is substantially flat.

7. The wafer with a test structure of claim 1, wherein there is no delamination or crack on a sidewall of each of the two second trenches.

8. The wafer with a test structure of claim 2, wherein the test structure is not exposed through the two first trenches, and the first metal connection and the second metal connection are not exposed through the two first trenches.

9. The wafer with a test structure of claim 2, further comprising a protective layer covering the first metal connection and the second metal connection.

10. The wafer with a test structure of claim 1, wherein a depth of each of the two first trenches is 8 to 15 micrometers.

11. The wafer with a test structure of claim 1, wherein in the sectional view taken along the line passing through the first die, the test structure, the second die, and the scribe line, the two first trenches are disposed on the same scribe line.

\* \* \* \* \*